United States Patent
Li et al.

(10) Patent No.: US 11,626,491 B2
(45) Date of Patent: Apr. 11, 2023

(54) INDIUM NITRIDE NANOPILLAR EPITAXIAL WAFER GROWN ON ALUMINUM FOIL SUBSTRATE AND PREPARATION METHOD OF INDIUM NITRIDE NANOPILLAR EPITAXIAL WAFER

(71) Applicant: SOUTH CHINA UNIVERSITY OF TECHNOLOGY, Guangzhou (CN)

(72) Inventors: Guoqiang Li, Guangzhou (CN); Fangliang Gao, Guangzhou (CN); Zhenzhu Xu, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 448 days.

(21) Appl. No.: 16/961,124

(22) PCT Filed: Oct. 19, 2018

(86) PCT No.: PCT/CN2018/110986
§ 371 (c)(1),
(2) Date: Jul. 9, 2020

(87) PCT Pub. No.: WO2019/137059
PCT Pub. Date: Jul. 18, 2019

(65) Prior Publication Data
US 2020/0343346 A1    Oct. 29, 2020

(30) Foreign Application Priority Data
Jan. 11, 2018 (CN) .......................... 201810027240.9

(51) Int. Cl.
*H01L 29/06* (2006.01)
*H01L 29/20* (2006.01)
*H01L 21/02* (2006.01)

(52) U.S. Cl.
CPC ...... *H01L 29/2003* (2013.01); *H01L 21/0254* (2013.01); *H01L 21/02425* (2013.01);
(Continued)

(58) Field of Classification Search
CPC ............................... B82Y 30/00; B82Y 40/00
See application file for complete search history.

(56) References Cited

U.S. PATENT DOCUMENTS

2011/0127490 A1* 6/2011 Mi ..................... H01L 21/0254
257/E29.168
2012/0001153 A1* 1/2012 Hersee ................. H01L 29/413
977/762

FOREIGN PATENT DOCUMENTS

| CN | 103996610 A | 8/2014 |
| CN | 108206130 A | 6/2018 |
| CN | 208157359 U | 11/2018 |

OTHER PUBLICATIONS

Xiao Wang et al. "Selective-Area Growth of Transferable InN Nanocolumns by Using Anodic Aluminum Oxide Nanotemplates", Nanoscale Res Letter; Dec. 2017; 12(1) : 145 (Year: 2017).*
(Continued)

*Primary Examiner* — Suberr L Chi
(74) *Attorney, Agent, or Firm* — Loza & Loza, LLP; Michael F. Fedrick

(57) ABSTRACT

An InN nanorod epitaxial wafer grown on an aluminum foil substrate (1) sequentially comprises the aluminum foil substrate (1), an amorphous aluminum oxide layer (2), an AlN layer (3) and an InN nanorod layer, (4) from bottom to top. The wafer can be prepared by pretreating the aluminum foil substrate with an oxidized surface and carrying out an in-situ annealing treatment; then, in a molecular beam epitaxial growth process, forming AlN nucleation sites on the annealed aluminum foil substrate, nucleating on the AlN and growing InN nanorods on the AlN, where the substrate
(Continued)

temperature is 400-700° C., the pressure of a reaction chamber is $4.0\text{-}10.0\times10^{-5}$ Torr and the beam ratio of V/III is 20-40.

9 Claims, 1 Drawing Sheet

(52) U.S. Cl.
CPC .. *H01L 21/02488* (2013.01); *H01L 21/02603* (2013.01); *H01L 29/0676* (2013.01)

(56) References Cited

OTHER PUBLICATIONS

Meletis, E. I. et al., "Formation of aluminum nitride by intensified plasma ion nitriding"; Journal of Vacuum Science & Technology A, 9(4):2279-2284 (1991); 7 pages.

International Search Report for International Application No. PCT/CN2018/110986, dated Jan. 21, 2019, 3 pages.

Grandal, J. et al., "Morphology and optical properties of InN layers grown by molecular beam epitaxy on silicon substrates"; phys. stat. sol. (c), 2(7):2289-2292 (2005); 4 pages.

Shim, Yun-Keun et al., "The properties of AlN prepared by plasma nitriding and plasma source ion implantation techniques"; Surface and Coatings Technology, 131:345-349 (2000); 5 pages.

\* cited by examiner

INDIUM NITRIDE NANOPILLAR EPITAXIAL WAFER GROWN ON ALUMINUM FOIL SUBSTRATE AND PREPARATION METHOD OF INDIUM NITRIDE NANOPILLAR EPITAXIAL WAFER

CROSS-REFERENCE TO RELATED APPLICATIONS

This application is the U.S. national stage of International Patent Application No. PCT/CN2018/110986, filed on Oct. 19, 2018 and entitled INDIUM NITRIDE NANOPILLAR EPITAXIAL WAFER GROWN ON ALUMINUM FOIL SUBSTRATE AND PREPARATION METHOD OF INDIUM NITRIDE NANOPILLAR EPITAXIAL WAFER, which claims the benefit of priority under 35 U.S.C. § 119 from Chinese Patent Application No. 201810027240.9, filed Jan. 11, 2018. The disclosures of the foregoing applications are incorporated herein by reference in their entirety.

TECHNICAL FIELD

The invention belongs to the technical field of nitride semiconductor devices, and relates to an indium nitride (InN) nanorod epitaxial wafer and a preparation method thereof, in particular to an InN nanorod epitaxial wafer grown on an aluminum foil substrate and a preparation method thereof.

BACKGROUND ART

Group III-V nitrides are widely used in Light Emitting Diodes (LEDs), lasers, and optoelectronic devices due to their advantages of stable physicochemical properties, high thermal conductivity, and high electron saturation velocity. Among group III-V nitrides, indium nitride (InN) is of increasing interest to researchers due to its unique advantages. In group III nitride semiconductors, InN has the smallest effective electron mass, the highest carrier mobility, and the highest saturation transition velocity, which are extremely advantageous for developing high-speed electronic devices. Moreover, InN has the smallest direct band gap with a forbidden band width of about 0.7 eV, so that the light emitting range of a nitride-based LED is widened from ultraviolet area (6.2 eV) to near infrared area (0.7 eV), allowing the nitride-based LED to show great application prospects in infrared lasers, full spectrum displays, high conversion efficiency solar cells, etc. In addition to the above advantages, nanoscale InN materials also exhibit other novel properties in quantum effect, interfacial effect, volume effect, size effect, etc. compared to other III-V nitride semiconductor materials.

At present, III-V nitride semiconductor devices are mainly prepared by epitaxial growth on sapphire substrates. However, due to the low thermal conductivity (45 W/m·K) of sapphire, a high-power nitride semiconductor device using sapphire as a substrate cannot efficiently dissipate heat, and the heat may be accumulated to increase the temperature and deteriorate the nitride semiconductor device, resulting in poor device performance and short lifetime. In contrast, Si has a higher thermal conductivity (150 W/m·K) than sapphire and is less expensive. Researchers have prepared high performance, low cost nitride semiconductor devices on Si substrates. However, the growth of InN nanorods with uniform diameter and high orderliness is a prerequisite for preparing high-performance nitride semiconductor photoelectric devices. Due to the distinct lattice mismatch and thermal mismatch between Si and InN and the different distribution ratio of In and N atoms on the substrate surface in the initial growth stage, the grown InN nanorods may have uneven height, diameter and length, poor orderliness, etc. In addition, when preparing a nitride light-emitting device by growing InN nanorods epitaxially on a Si substrate, due to the light absorption feature of the Si substrate, the light-emitting efficiency of the prepared device is low, and therefore the Si substrate should be removed when preparing the device, which complicates the preparation of the device.

Therefore, there is an urgent need to find a substrate which has high thermal conductivity and can rapidly transfer heat generated during the operation of the nitride semiconductor device. Using aluminum foil as a substrate material of the epitaxial InN nanorods has three unique advantages. Firstly, the aluminum foil has a very high thermal conductivity of 204 W/m·K, and can conduct the heat generated during the operation of the nitride semiconductor device in time, thereby reducing the temperature of the working junction of the device and solving the heat dissipation problem of the device. Secondly, the aluminum foil can be used as an electrode of a vertical nitride semiconductor device, so that current almost completely flows through the epitaxial layer, thereby reducing the resistance, avoiding current crowding, distributing the current uniformly, and improving the performance of the nitride semiconductor device. Thirdly, the aluminum foil substrate is cheaper than a monocrystalline substrate, and the manufacturing cost of the device can be greatly reduced.

Different from epitaxial growth of nanorods on a monocrystalline substrate, when aluminum foil is used for epitaxial growth of the nanorods, because the aluminum foil is readily subjected to oxidation reaction in air, a layer of thin amorphous aluminum oxide may be formed on the surface of the aluminum foil, and atoms of the amorphous aluminum oxide layer on the surface of the substrate are in disordered arrangement. Therefore, the nanorods cannot nucleate and grow on the surface of the substrate through a conventional growth method such as MOCVD (metal organic chemical vapor deposition), CVD (chemical vapor deposition) and PLD (pulsed laser deposition), and nanorods with uniform diameter, high orderliness and vertical growth cannot be epitaxially grown.

SUMMARY OF INVENTION

In order to overcome the above disadvantages and defects of the prior art, the present invention aims to provide an InN nanorod epitaxial wafer grown on an aluminum foil substrate, wherein an aluminum oxide amorphous layer on the surface of the aluminum foil substrate is bombarded by high-activity nitrogen plasma at the initial growth stage to form nucleation sites of AlN on the surface of the aluminum foil, which facilitates nucleation and further growth of InN nanorods, and solves the technical problem of providing an upright InN nanorod with a uniform diameter on an aluminum foil substrate by epitaxial growth. Meantime, the defect density of the InN nanorod epitaxial layer is greatly reduced, the radiation recombination efficiency of current carriers is improved, and the luminous efficiency of nitride devices such as a semiconductor laser or an LED is significantly increased.

Another object of the present invention is to provide a method for preparing the InN nanorod epitaxial wafer grown on the aluminum foil substrate, which has the advantages of simple growth process, controllable appearance of the nanorod, and low preparation cost.

The purpose of the invention is realized by the following technical solution:

An InN nanorod epitaxial wafer grown on an aluminum foil substrate sequentially comprises the aluminum foil substrate, an amorphous aluminum oxide layer, an AlN layer and an InN nanorod layer from bottom to top.

The thickness of the aluminum foil substrate is 100-800 μm, and the aluminum foil substrate consists of an amorphous or polycrystalline material.

The diameter of the InN nanorods in the InN nanorod layer is 30-80 nm.

A method for preparing the InN nanorod epitaxial wafer grown on an aluminum foil substrate comprises the following steps:

(1) pretreatment: pretreating the aluminum foil with an oxidized surface;

(2) carrying out an in-situ annealing treatment;

(3) in a molecular beam epitaxial growth process, forming AlN nucleation sites on an annealed aluminum foil substrate, nucleating on the AlN and growing InN nanorods on the AlN, wherein the substrate temperature is 400-700° C., the pressure of a reaction chamber is $4.0\text{-}10.0\times10^{-5}$ Torr and the beam ratio of V/III is 20-40.

The in-situ annealing treatment in step (2) comprises: placing the aluminum foil substrate with the oxidized surface in a device for molecular beam epitaxial growth, carrying out the in-situ annealing treatment for 15-30 min to obtain the annealed aluminum foil substrate, wherein the substrate temperature is 400-550° C. and the pressure of a reaction chamber is $5.0\text{-}6.0\times10^{-10}$ Torr.

In the molecular beam epitaxial growth process of step (3), the source of the nitrogen in the InN nanorod layer is nitrogen gas, wherein the nitrogen gas is ionized under high-pressure to obtain nitrogen plasma, and the flow rate of the nitrogen gas is 1-4 sccm; and the source of the indium is a solid metal, wherein the solid metal is heated and evaporated to form an atom beam, and the temperature of the In beam is 750-810° C.

The pretreatment in step (1) comprises polishing, grinding and cleaning the aluminum foil with the oxidized surface to obtain a pretreated aluminum foil substrate (the surface of the aluminum foil may be easily oxidized, and the pretreated aluminum foil substrate comprises aluminum oxide on the surface);

the cleaning specifically comprises: placing the polished aluminum foil into absolute ethyl alcohol for ultrasonic treatment for 1-2 min, then placing same into deionized water for ultrasonic treatment for 1-2 min, and drying same by high-purity dry nitrogen gas.

The cleaning in step (1) specifically comprises:

mechanically polishing and grinding the aluminum foil to obtain a flat surface; and then placing the aluminum foil with the flat surface into absolute ethyl alcohol for ultrasonic treatment for 1-2 min to remove organic pollutants and sticky particles on the surface of the aluminum foil substrate, then placing the aluminum foil into deionized water for ultrasonic treatment for 1-2 min to remove surface impurities, and drying same by high-purity dry nitrogen gas.

The aluminum foil contains 0.06-0.1% (by mass) of copper (Cu) element.

The diameter of the InN nanorods in the InN nanorod layer in step (3) is 30-80 nm.

The in-situ annealing is carried out to further remove pollutants such as organic matters on the surface of the aluminum foil. The surface of the aluminum foil after annealing still has an amorphous aluminum oxide layer.

In the present invention AlN nucleation sites are formed on the surface of the aluminum foil under the bombardment of high-activity nitrogen plasma in the initial growth stage. The highly reactive nitrogen plasma reacts with Al on the substrate surface to form AlN. Formation of AlN on the surface of the aluminum foil facilitates the subsequent InN growth. Due to the thin amorphous layer on the surface of the aluminum foil, the nanorods cannot be grown through a conventional epitaxial growth method, such as Metal Organic Chemical Vapor Deposition (MOCVD), Chemical Vapor Deposition (CVD), and Pulsed Laser Deposition (PLD).

The InN nanorod grown on the aluminum foil substrate has the characteristics of uniform diameter, high order and upright configuration.

Compared with the prior art, the invention has the following advantages and beneficial effects:

(1) The InN nanorod epitaxial wafer grown on the aluminum foil substrate of the invention forms AlN nucleation sites on the surface of the aluminum foil bombarded by high-activity nitrogen plasma in the initial growth stage, which facilitates nucleation and further growth of the InN nanorod. The method solves the technical problem of forming upright InN nanorods with a uniform diameter on the aluminum foil substrate by epitaxial growth, greatly reduces the defect density of the InN nanorod epitaxial layer, improves the radiation recombination efficiency of a current carrier, and increases the luminous efficiency of nitride devices such as a semiconductor laser and a light-emitting diode.

(2) The InN nanorod epitaxial wafer grown on the aluminum foil substrate of the invention uses an aluminum foil as a substrate, which has the advantage of high conductivity. Manufacturing an electrode on the epitaxially grown InN nanorod semiconductor epitaxial wafer may facilitate the preparation of a vertical nitride semiconductor device. Meanwhile, the aluminum foil substrate has the advantages of high heat conductivity, high temperature resistance and the like, and thus exhibits high reliability. The InN nanorod epitaxial wafer on the aluminum foil substrate may be widely applied in high-temperature devices.

(3) The method uses an aluminum foil as a substrate and forms AlN nucleation sites on the surface of the aluminum foil bombarded by high-activity nitrogen plasma in the initial growth stage of molecular beam epitaxy, which facilitates nucleation and further growth of InN nanorods, solves the problem of growing InN nanorods on an aluminum foil substrate by molecular beam epitaxy, and helps form InN nanorods with high orderliness and uniform diameter. Then, the technical problem that InN nanorods with uniform diameter are difficult to directly grow on an amorphous/polycrystalline aluminum foil substrate is solved.

(4) The growth process of the invention is unique, simple, feasible and repeatable.

DETAILED DESCRIPTION

The present invention will be described in further detail with reference to examples and drawings, but the embodiments of the present invention are not limited thereto.

Figure 1:
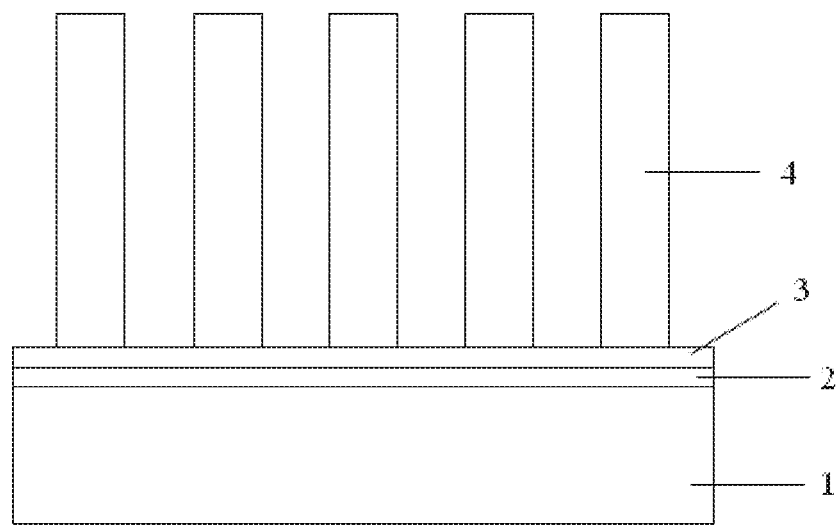
FIG. 1 shows a structural diagram of an InN nanorod epitaxial wafer grown on an aluminum foil substrate of the present invention; aluminum foil substrate—1, amorphous aluminum oxide layer—2, AlN layer—3; and InN nanorod layer—4.

The structural diagram of the InN nanorod epitaxial wafer grown on the aluminum foil substrate is shown in FIG. 1, and the InN nanorod epitaxial wafer sequentially comprises an aluminum foil substrate 1, an amorphous aluminum oxide layer 2, an AlN layer 3 and an InN nanorod layer 4 from bottom to top. The InN nanorod layer 4 adopts AlN as nucleation sites, and nucleating on the AlN to grow InN nanorods.

The thickness of the aluminum foil substrate is 100-800 μm, and the aluminum foil substrate consists of an amorphous or polycrystalline material.

The diameter of the InN nanorod in the InN nanorod layer is 30-80 nm.

Example 1

An InN nanorod epitaxial wafer grown on an aluminum foil substrate of this Example sequentially comprises, from bottom to top, an aluminum foil substrate, an amorphous aluminum oxide layer, an AlN layer, and an InN nanorod layer.

The preparation method of the InN nanorod epitaxial wafer grown on the aluminum foil substrate in the Example comprises:

(1) Selection of a substrate: selecting a commonly used commercial aluminum foil substrate (with an oxidized surface);

(2) polishing and cleaning the substrate: mechanically polishing and grinding the aluminum foil to obtain a flat surface; then placing the aluminum foil with the flat surface into absolute ethyl alcohol for ultrasonic treatment for 1 min to remove organic pollutants and sticky particles, then placing the aluminum foil into deionized water for ultrasonic treatment for 1 min to remove surface impurities, and drying same by high-purity dry nitrogen gas;

(3) in-situ annealing to further remove contaminants from the aluminum foil surface: placing the aluminum foil substrate into a device for molecular beam epitaxial growth, and carrying out the in-situ annealing for 30 minutes with a substrate temperature of 400° C. and a pressure of a reaction chamber of $6.0 \times 10^{10}$ Torr; wherein after polishing, cleaning and in-situ annealing, amorphous aluminum oxide still remains on the surface of the aluminum foil;

(4) growth of InN nanorods with uniform diameter: in a molecular beam epitaxial growth process, forming AlN nucleation sites on the aluminum foil substrate in step (3), nucleating on the AlN and growing InN nanorods on the AlN, wherein the substrate temperature is 400° C., the pressure of a reaction chamber is $6.0 \times 10^{-5}$ Torr and the beam ratio of V/III is 30; and the InN nanorods has a uniform diameter of 30-80 nm from top to bottom.

In the molecular beam epitaxial growth process, the source of the nitrogen in the InN nanorod layer is nitrogen gas, wherein the nitrogen gas is ionized under high-pressure to obtain nitrogen plasma, and the flow rate of the nitrogen gas is 2 sccm; the source of the indium is a solid metal, wherein the solid metal is heated and evaporated to form an atom beam, and the temperature of the In beam is 810° C.

In the growth of the InN nanorods on an aluminum foil substrate of Example 1, no significant dislocation defects were observed for the nanorods, indicating that the grown InN nanorods have high crystal quality.

Figure 2:
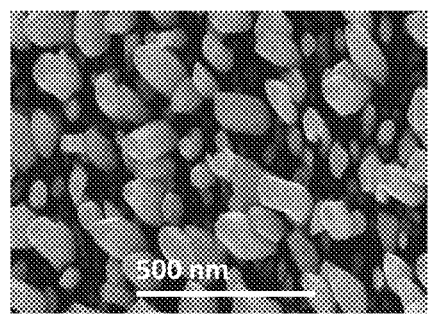
FIG. 2 is a scanning electron microscope spectrum of the InN nanorods epitaxially grown on an aluminum foil substrate in Example 1.

FIG. 2 is a scanning electron micrograph of the InN nanorods grown on an aluminum foil substrate in Example 1, showing that the InN nanorods are highly ordered and uniform in diameter, and the InN nanorod epitaxial wafer prepared by the invention has excellent performance.

Example 2

An InN nanorod epitaxial wafer grown on an aluminum foil substrate of this Example sequentially comprises, from bottom to top, an aluminum foil substrate, an amorphous aluminum oxide layer, an AlN layer, and an InN nanorod layer. The InN nanorod layer 4 adopts AlN as nucleation sites, and nucleating on the AlN to grow InN nanorods.

The preparation method of the InN nanorod epitaxial wafer grown on the aluminum foil substrate in the Example comprises:

(1) Selection of a substrate and the crystal orientation thereof: selecting a commonly used commercial aluminum foil substrate;

(2) polishing and cleaning the substrate: mechanically polishing and grinding the aluminum foil to obtain a flat surface; then placing the aluminum foil with the flat surface into absolute ethyl alcohol for ultrasonic treatment for 2 min to remove organic pollutants and sticky particles, then placing the aluminum foil into deionized water for ultrasonic treatment for 2 min to remove surface impurities, and drying same by high-purity dry nitrogen gas;

(3) in-situ (vacuum) annealing to further remove contaminants from the aluminum foil surface: placing the aluminum foil substrate into a device for molecular beam epitaxial growth, and carrying out the in-situ annealing for 15 minutes with a substrate temperature of 550° C. and a pressure of a reaction chamber of $5.0 \times 10^{-10}$ Torr; wherein after polishing, cleaning and in-situ annealing, amorphous aluminum oxide still remains on the surface of the aluminum foil;

(4) growth of InN nanorods with uniform diameter: in a molecular beam epitaxial growth process, forming AlN nucleation sites on the aluminum foil substrate in step (3), nucleating on the AlN and growing InN nanorods on the AlN, wherein the substrate temperature is 600° C., the pressure of a reaction chamber is $6.0 \times 10^{-5}$ Torr and the beam ratio of V/III is 40; and the InN nanorods has a uniform diameter of 30-80 nm from top to bottom. In the molecular beam epitaxial growth process, the source of nitrogen in the InN nanorod layer is nitrogen gas, wherein the nitrogen gas is ionized under high-pressure to obtain nitrogen plasma, and the flow rate of the nitrogen gas is 3 sccm; the source of the indium is a solid metal, wherein the solid metal is heated and evaporated to form an atom beam, and the temperature of the In beam is 760° C.

The InN nanorod epitaxial wafer on the aluminum foil substrate prepared in this Example is outstanding in electrical properties, optical properties, defect density, and crystal quality. No obvious dislocation defects were observed in the nanorods, indicating that the grown InN nanorods have high crystal quality.

The above-mentioned embodiments are preferred embodiments of the present invention, but the embodiments of the present invention are not limited by the described embodiments. Any other changes, modifications, substitutions, combinations and simplification made without departing from the spirit and principles of the present invention should be equivalent replacement methods and are included in the scope of protection of the present invention.

The invention claimed is:

1. An InN nanorod epitaxial wafer grown on an aluminum foil substrate, wherein the InN nanorod epitaxial wafer, from bottom to top, sequentially comprises the aluminum foil substrate, an amorphous aluminum oxide layer, an AlN layer, and an InN nanorod layer.

2. The InN nanorod epitaxial wafer grown on an aluminum foil substrate according to claim 1, characterized in that the aluminum foil substrate has a thickness of 100-800 μm.

3. The InN nanorod epitaxial wafer grown on an aluminum foil substrate according to claim 1, characterized in that the aluminum foil substrate consists of an amorphous or polycrystalline material.

4. The InN nanorod epitaxial wafer grown on an aluminum foil substrate according to claim 3, characterized in that the aluminum foil substrate comprises Cu.

5. The InN nanorod epitaxial wafer grown on an aluminum foil substrate according to claim 1, characterized in that the InN nanorod layer comprises InN nanorods having a diameter of 30-80 nm.

6. A method for preparing the InN nanorod epitaxial wafer grown on an aluminum foil substrate according to claim 1 comprising the following steps:
   (1) pretreating an oxidized surface of the aluminum foil substrate;
   (2) carrying out an in-situ annealing treatment on the oxidized surface of the aluminum foil substrate to form an annealed aluminum foil substrate;
   (3) in a reaction chamber of a device for molecular beam epitaxial growth, forming AlN nucleation sites on the annealed aluminum foil substrate, nucleating on the AlN, and growing InN nanorods on the AlN, wherein a temperature of the aluminum foil substrate is 400-700° C., a pressure of the reaction chamber is $4.0\text{-}10.0\times10^{-5}$ Torr, and the beam ratio of V/III is 20-40.

7. The method for preparing the InN nanorod epitaxial wafer grown on an aluminum foil substrate according to claim 6, characterized in that the annealing treatment in step (2) comprises placing the aluminum foil substrate in the device for molecular beam epitaxial growth and carrying out the in-situ annealing treatment for 15-30 min to obtain the annealed aluminum foil substrate, wherein the substrate temperature is 400-550° C. and the pressure of the reaction chamber is $5.0\text{-}6.0\times10^{-10}$ Torr.

8. The method for preparing the InN nanorod epitaxial wafer grown on an aluminum foil substrate according to claim 6, characterized in that the pretreatment in step (1) comprises polishing, grinding and cleaning the aluminum foil substrate to obtain a pretreated aluminum foil substrate.

9. The method for preparing the InN nanorod epitaxial wafer grown on an aluminum foil substrate according to claim 6, characterized in that a diameter of the InN nanorods in the InN nanorod layer is 30-80 nm.

* * * * *